United States Patent
Ratnam et al.

(10) Patent No.: US 6,429,076 B2
(45) Date of Patent: Aug. 6, 2002

(54) FLASH EPROM MEMORY CELL HAVING INCREASED CAPACITIVE COUPLING AND METHOD OF MANUFACTURE THEREOF

(75) Inventors: Perumal Ratnam; Ritu Shrivastava, both of Fremont, CA (US)

(73) Assignee: Alliance Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/766,971

(22) Filed: Jan. 22, 2001

Related U.S. Application Data

(62) Division of application No. 08/713,292, filed on Sep. 13, 1996, now Pat. No. 6,166,409.

(51) Int. Cl.[7] .......................................... H01L 21/8247
(52) U.S. Cl. ...................................................... 438/264
(58) Field of Search ................................. 438/257–267

(56) References Cited

U.S. PATENT DOCUMENTS

| | | | |
|---|---|---|---|
| 4,169,291 A | 9/1979 | Rossler | 365/185 |
| 4,328,565 A | 5/1982 | Harari | 365/185 |
| 4,698,787 A | 10/1987 | Mukherjee et al. | 365/185 |
| 4,713,677 A | 12/1987 | Tigelaar et al. | 357/23.5 |
| 5,143,860 A | 9/1992 | Mitchell et al. | 437/43 |
| 5,291,439 A | 3/1994 | Kauffman et al. | 365/185 |
| 5,343,063 A | 8/1994 | Yuan et al. | 257/317 |
| 5,378,643 A | 1/1995 | Ajika et al. | 437/43 |
| 5,382,540 A | 1/1995 | Sharma et al. | 437/52 |
| 5,411,905 A | 5/1995 | Acovic et al. | 437/43 |
| 5,483,487 A | 1/1996 | Sung-Mu | 365/185.33 |
| 5,543,339 A | 8/1996 | Roth et al. | 437/43 |
| 5,721,441 A | 2/1998 | Lee | 257/315 |
| 5,723,888 A | 3/1998 | Yu | 257/319 |
| 5,923,976 A * | 7/1999 | Kim | 438/261 |

FOREIGN PATENT DOCUMENTS

| | | | |
|---|---|---|---|
| JP | 62-14473 | 2/1987 | H01L/29/78 |

* cited by examiner

*Primary Examiner*—Richard Booth
(74) *Attorney, Agent, or Firm*—Stallman & Pollock LLP

(57) ABSTRACT

A flash EPROM cell (10) is disclosed having increased capacitive coupling between a floating gate (28) and a control gate (32). Vertical structural elements (34a and 34b) are formed on field oxide regions (20) on opposing sides of the flash EPROM cell channel 20, in the channel width direction. The structural elements (34a and 34b) include relatively vertical faces. The floating gate (28) conformally cover the channel 20 and the vertical faces of the structural elements (34a and 34b). The control gate (32) conformally covers the floating gate (28). The vertical displacement introduced by the structural elements (34a and 34b) increases the overlap area between the floating gate (28) and the control gate (32) without increasing the overlap area of the floating gate (28) and the channel 20, resulting in increased capacitive coupling between the control gate (32) and the floating gate (28). A process is disclosed which enables the formation of the above structural elements (34a and 34b) with dimensions that are smaller than those normally achievable by the minimum resolution of lithography equipment.

22 Claims, 12 Drawing Sheets

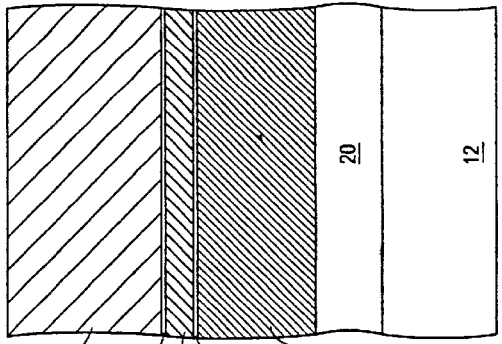
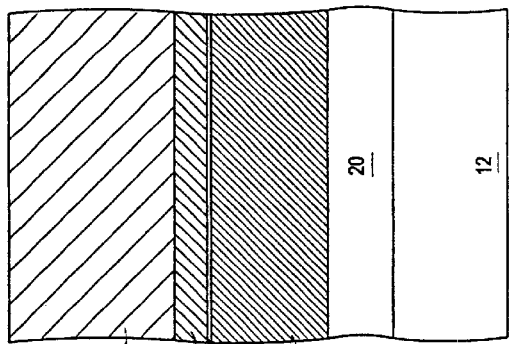
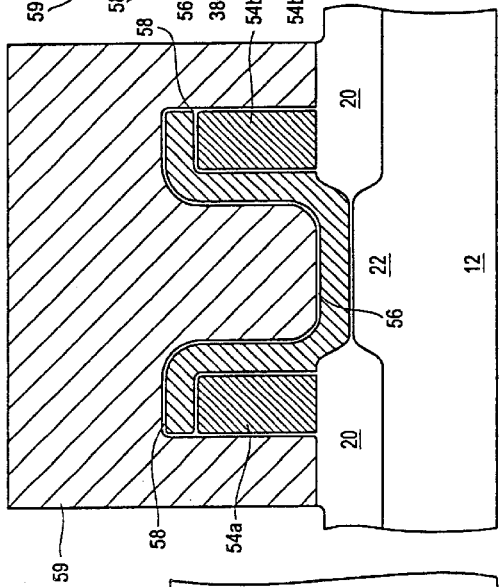
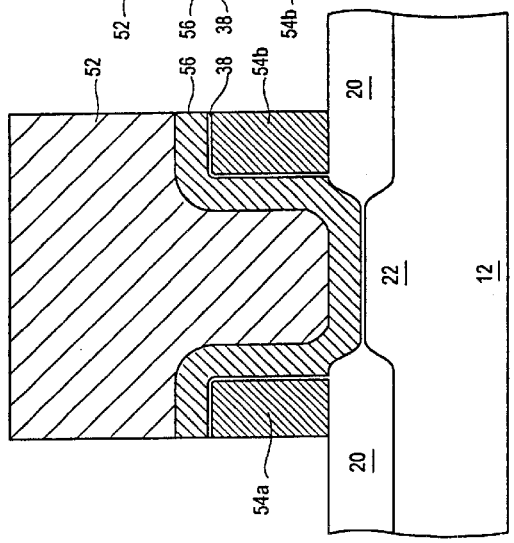
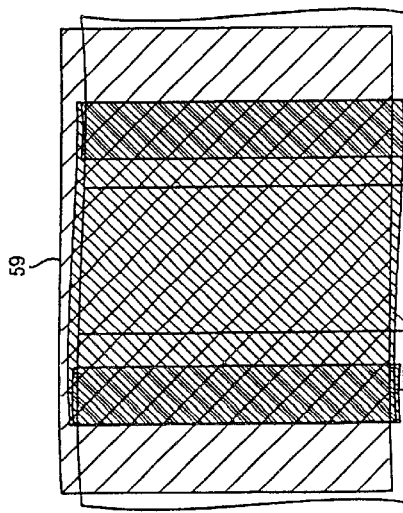
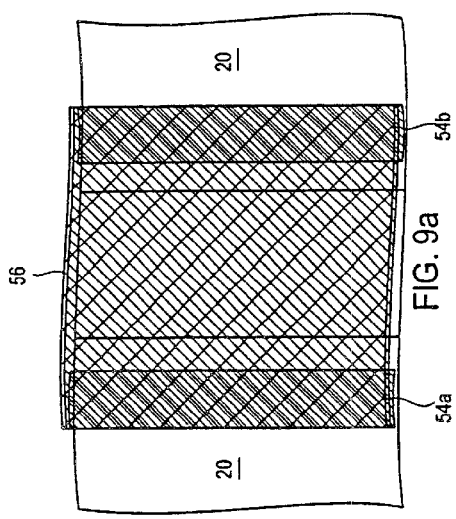

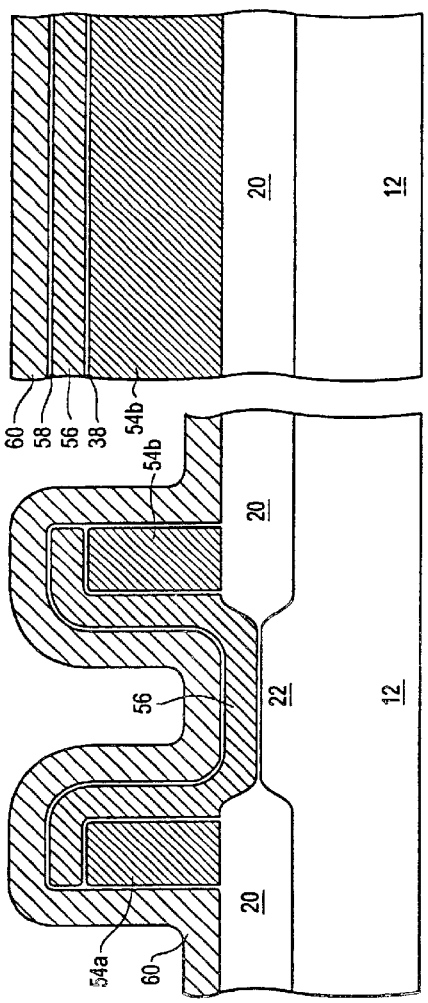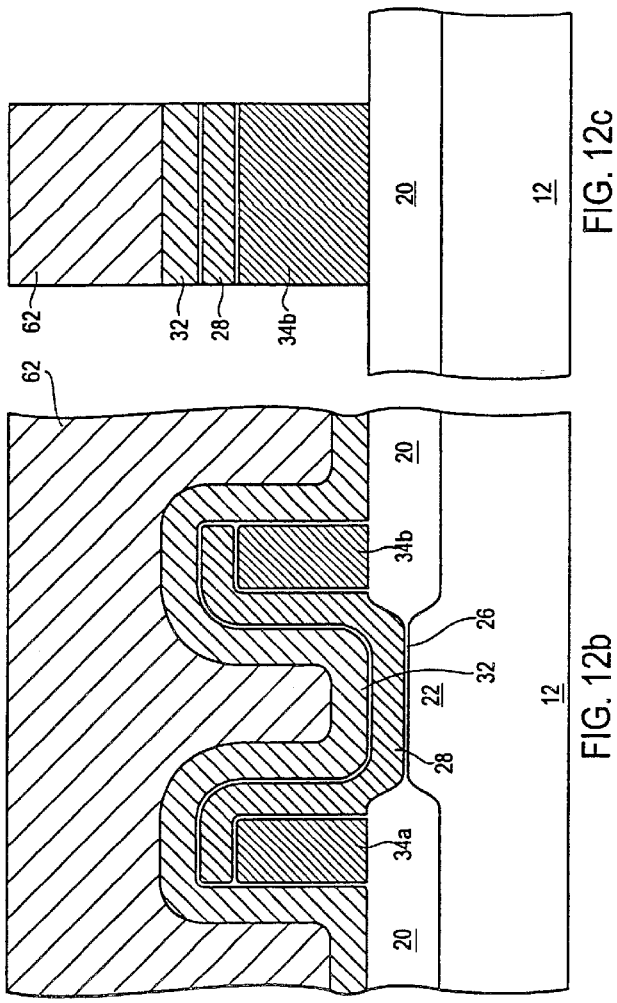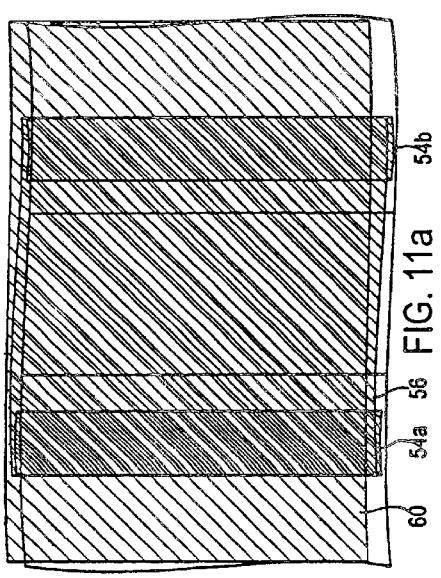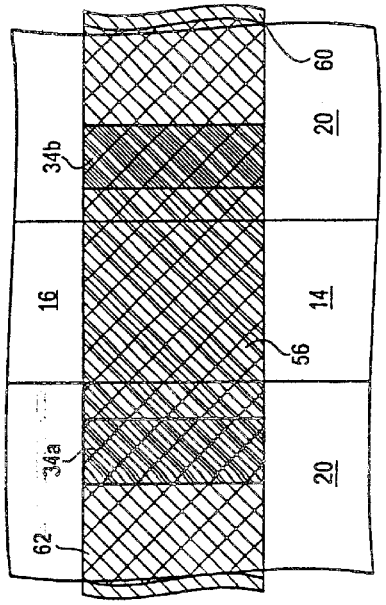

FLASH EPROM MEMORY CELL HAVING INCREASED CAPACITIVE COUPLING AND METHOD OF MANUFACTURE THEREOF

This is a divisional of application Ser. No. 08/713,292, filed Sep. 13, 1996, is now U.S. Pat. No. 6,166,409.

TECHNICAL FIELD

The present invention relates generally to the manufacture of integrated circuits and more particularly to integrated circuits employing floating gates and control gates that are capacitively coupled to one another.

BACKGROUND OF THE INVENTION

Currently, many non-volatile memory devices have information storage cells that employ "floating" gate structures. Floating gates are created by electrically isolating an electron storing structure by one or more dielectric layers. Charge can then be placed on, or removed from the floating gate. The resulting charge on the floating gate is used to alter the memory cell parameters. For example, a single transistor storage cell is created by situating the floating gate in-between a control gate and its corresponding transistor channel. According to the charge on the floating gate, the threshold of the transistor is altered. For many non-volatile memories a cell is "programmed" by placing electrons on a floating gate, and "erased" by removing electrons from the gate.

A discussion of electron transport mechanisms used in the programming and erasure of non-volatile memories is set forth in U.S. Pat. No. 4,328,565, issued to Eliyahou Harari, on May 4, 1982. Harari notes that for erasable programmable read only memories (EPROMs), channel hot electron injection is used to place electrons on floating gates, while the application of ultraviolet light, or Fowler-Nordheim tunneling, can be used to remove electrons from the floating gate. Hot electron injection usually involves raising the control gate and drain to a relatively high potential with respect to the source. Fowler-Nordheim tunneling is accomplished by applying a strong electric field between the floating gate and the control gate or substrate. For example, a negative gate voltage between the source and the control gate. Harari notes that an important factor in programming EPROM cells is the capacitive coupling between the control gate and the floating gate. In addition, Harari indicates that the capacitive coupling is dependent upon the geometric overlap between the floating gate and the control gate, and the nature of the dielectric therebetween. (This dielectric is often referred to as the "inter-poly" dielectric in those structures that employ polysilicon floating gates and control gates. For the purposes of this description the dielectric separating the control gate from the floating gate will be referred to in this description as an "intergate" dielectric.)

U.S. Pat. No. 4,713,677 issued to Tigelaar et al. on Dec. 15, 1987 notes that the. tunneling voltage increases as the capacitive coupling between the control gate and floating gate increases. Tigelaar et al. discloses an electricaly erasable PROM (EEPROM) wherein the capacitive coupling between the floating gate and control gate is increased by a trench capacitor adjacent to the active area on the floating gate.

Other approaches for increasing the capacitive coupling between the control gate and the floating gate are known in the prior art. U.S. Pat. No. 4,169,291 issued to Bemward Rossler on Sep. 25, 1979 illustrates a "V-MOS" EPROM cell. The geometric overlap between the floating gate and the control gate is increased by forming the transistor within a groove etched into the substrate.

U.S. Pat. No. 5,143,860 issued to Mitchell et al. on Sep. 1, 1992 discloses an EPROM cell having sidewall floating gates. The sidewall floating gate arrangement increases the surface area of the floating gate that is adjacent to the control gate, and thus increases the capacitive coupling between the two.

U.S. Pat. No. 5,343,063 issued to Yuan et al. on Aug. 30, 1994 discloses a read only memory cell in which a floating gate is conformally formed within a thick dielectric trench. The control gate is then formed over the floating gate. The overlap area is increased due to the vertical extent of the thick dielectric trenches.

U.S. Pat. No. 5,378,643 issued to Ajika et al. on Jan. 3, 1995 discloses a flash EEPROM (EPROM) in which the control gate is formed by two layers of polysilicon, with the two layers surrounding the floating gate. By surrounding the floating gate with the control gate, effective overlap area between the control gate and the floating gate is increased.

U.S. Pat. No. 5,382,540 issued to Sharma et al. on Jan. 17, 1995 discloses a flash EEPROM (EPROM) in which the source, channel and drain are formed in epitaxial silicon pillars. The floating gates are formed by polysilicon sidewalls that surround the pillars. The control gate is formed over the entire pillar structure. The unique Sharna et al. device also increases capacitive coupling between the control gate and the floating gate by maximizing the surface area between the two. The conventional one transistor (1-T) flash EPROM cell is set forth in U.S. Pat. No. 4,698,787 issued to Mukherjee et al. on Oct. 6, 1987.

Commonly owned, co-pending U.S. patent application Ser. No. 08/456,080 entitled DRAM CELL WITH SELF-ALIGNED CONTACT AND METHOD OF FABRICATING SAME discloses a dynamic random access memory (DRAM) cell in which the DRAM capacitor area is increased by an initial, "thick" conductive layer.

While the prior art provides a number of approaches to increasing the surface area between a floating gate and its associated control gate, such approaches require complicated process technologies that substantially deviate from the current 1-T cell manufacturing processes. Further, increasing the overlap area between floating gates and control gates by trenches and similar techniques can result in poor intergate dielectric integrity, limiting the endurance and reliability of the device.

SUMMARY OF THE INVENTION

It is an object of the present invention to provide a non-volatile memory cell having increased capacitive coupling between a control gate an its associated floating gate(s).

It is another object of the present invention to provide a non-volatile memory cell having increased capacitive coupling between a control gate an its associated floating gate(s) that can be easily substituted for conventional, non-volatile memory cells.

It is another object of the present invention to provide a method of manufacturing a non-volatile memory cell having increased capacitive coupling between a control gate an its associated floating gate(s) that is easily integrated into conventional non-volatile memory fabrication processes.

The present invention includes an EPROM, EEPROM or flash EPROM cell having a vertically extending structure adjacent to a transistor channel. A floating gate is formed that overlaps both the channel and the vertically extending structure. A control gate is formed over the floating gate. The addition of the vertically extending structure increases the overlap area between the control gate and floating gate, which, in turn, increases the capacitive coupling between the two.

According to one aspect of the present invention, the vertically extending structure is formed from an initial, relatively thick layer of polysilicon.

According to another aspect of the present invention, the vertically extending structure is patterned from a deposited layer using the floating gate etch mask.

According to another aspect of the present invention, a 1-T flash EPROM includes a channel separated by field oxide regions in the channel width direction. Relatively thick polysilicon structures are formed on the opposing field oxide regions, and a floating gate conformally overlaps the thick polysilicon structures and the channel. A control gate conformally covers the floating gate.

According to another aspect of the present invention, the vertically extending structures are formed from a dielectric layer.

According to another aspect of the present invention, the floating gate is a multi-layered structure. A first floating gate layer is formed over a tunnel dielectric. The vertically extending structure is formed on the first floating gate layer, and a second floating gate layer overlaps the vertically extending structure and exposed portions of the first floating gate layer.

An advantage of the present invention is that it provides a one transistor flash EPROM cell wherein the polysilicon coupling between the control gate and the floating gate can be increased without increasing the size of the EPROM cell along the channel width direction.

Another advantage of the present invention is that it provides a one transistor flash EPROM cell that can be reduced in size along the transistor channel width direction.

Yet another advantage of the present invention is that it provides a method of fabricating a one transistor flash EPROM cell that does not require complicated trench etching steps.

Yet another advantage of the present invention is that it provides a one transistor flash EPROM cell that can be fabricated using conventional one transistor flash EPROM fabrication process.

Other objects and advantages of the present invention will become apparent in light of the following description thereof.

BRIEF DESCRIPTION OF THE DRAWINGS

FIGS. 3–12 illustrate a method of fabricating a flash EPROM cell according to the preferred embodiment.

DETAILED DESCRIPTION OF THE EMBODIMENTS

The preferred embodiment of the present invention is a one-transistor (1-T) stacked gate non-volatile memory (NVM) cell . The NVM cell is intended to be employed as one of many such cells arranged in rows and columns to form an EPROM, EEPROM or flash EPROM array. The array is divided into sectors (or blocks) composed of a number of sub-arrays, with the cells of the same sub-array row have floating gates that are capacitively coupled to the same control gate. Cells of the same sub-array column, have drain regions that are commonly coupled to the same bit lines. Array sectors have commonly coupled source nodes.

Figure 1C:
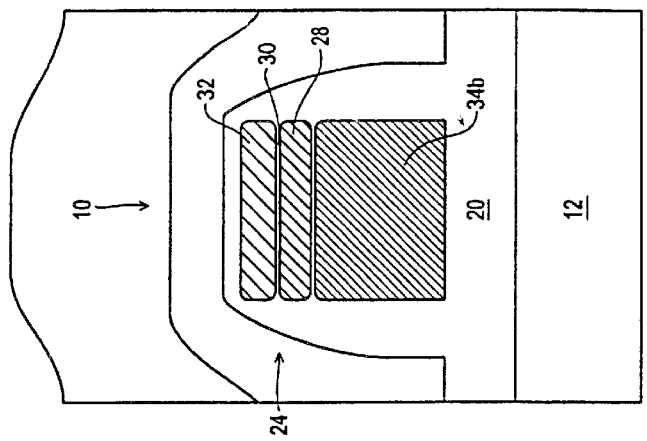
FIGS. 1a–1c illustrate a flash EPROM cell according to a preferred embodiment.
Figure 1A:
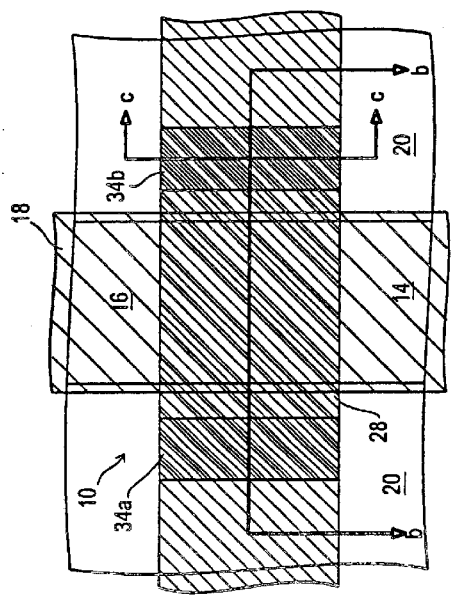
Figure 1B:
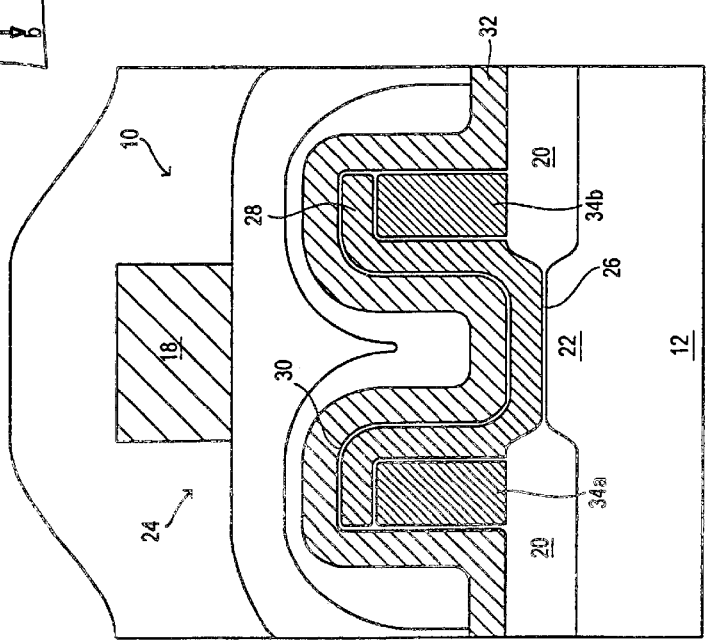

Referring now to FIGS. 1a–1c, the NVM cell, according to a preferred embodiment, is set forth generally in three views. FIG. 1a is a top plan. FIG. 1b is a side cross sectional view taken along line b—b of FIG. 1a (the channel width direction) FIG. 1c is a side cross sectional view taken along line c—c of FIG. 1a (parallel to the channel length). The NVM cell is designated by the general reference character 10 and is formed on a semiconductor substrate 12. Formed within the substrate 12 is a source region 14 and a drain region 16. In the preferred embodiment, NVM cells of the same array column are separated by alternating source regions and drain regions, these regions each being shared by two adjacent EPROM cells 10. Active areas within the semiconductor substrate 12 are separated by isolation devices. In the preferred embodiments the substrate 12 is p-doped, and the isolation devices are field oxide regions 20 created by an isolation process, such as a local oxidation of silicon (LOCOS) step. Source and drain regions (14 and 16) are formed by ion implanting an n-type dopant. Also set forth in FIGS. 1a–1c is a portion of the bit line 18. In the preferred embodiment, the bit line 18 extends in the channel width direction (the direction of line c—c) and commonly couples the drain regions 16 of NVM cells in a given sub-array column.

The preferred embodiment 10 includes many conventional flash EPROM cell elements; a channel region 22 is formed in the substrate between field oxide regions 20, and a stacked gate structure 24 is disposed over the channel region 12. The stacked gate structure 24, as in the case of conventional 1-T flash EPROM cells, includes a tunnel dielectric 26, formed on the surface of the channel region 22, a floating gate 28, an intergate dielectric 30, and a control gate 32. In the preferred embodiment the tunnel dielectric 26 is thermally grown silicon dioxide, and the floating gate 28 is doped polysilicon. The inter-gate dielectric 30 is a composite layer of ONO, and the control gate 32 is formed from a doped layer of polysilicon. Unlike conventional flash EPROM cells, the preferred embodiment further includes a first vertical structural element 34a and a second vertical structural element 34b.

The structural elements (34a and 34b) are formed on field oxide regions 20 on opposing sides of the channel region 22. The structural elements (34a and 34b) extend in a vertical direction away from the substrate. In the preferred embodiment, the structural elements (34a and 34b) are formed from a layer of polysilicon that has a thickness that is typically greater than that of the floating gate 28 or the control gate 32. The comparative vertical thickness of the structural elements (34a and 34b); should not be construed as limiting the invention. The floating gate 28 extends over the channel region 20 conformally covering the tunnel dielectric 26 and both the structural elements (34a and 34b). As a result, the overall exposed surface area of the floating gate 28 is increased due to the vertical displacement caused by the structural elements (34a and 34b). The floating gate 28 is completely covered by the intergate dielectric 30. The control gate 32, separated from the floating gate 28 by the intergate dielectric 30, is shown to follow the same general shape as the floating gate 28, and so also includes more surface area than conventional 1-T flash EPROM cells. Thus, the vertical displacement, of the structural elements (34a and 34b) adds to the overall surface area between the control gate 30 and the floating gate 28, increasing the capacitive coupling between the two.

Figure 2:
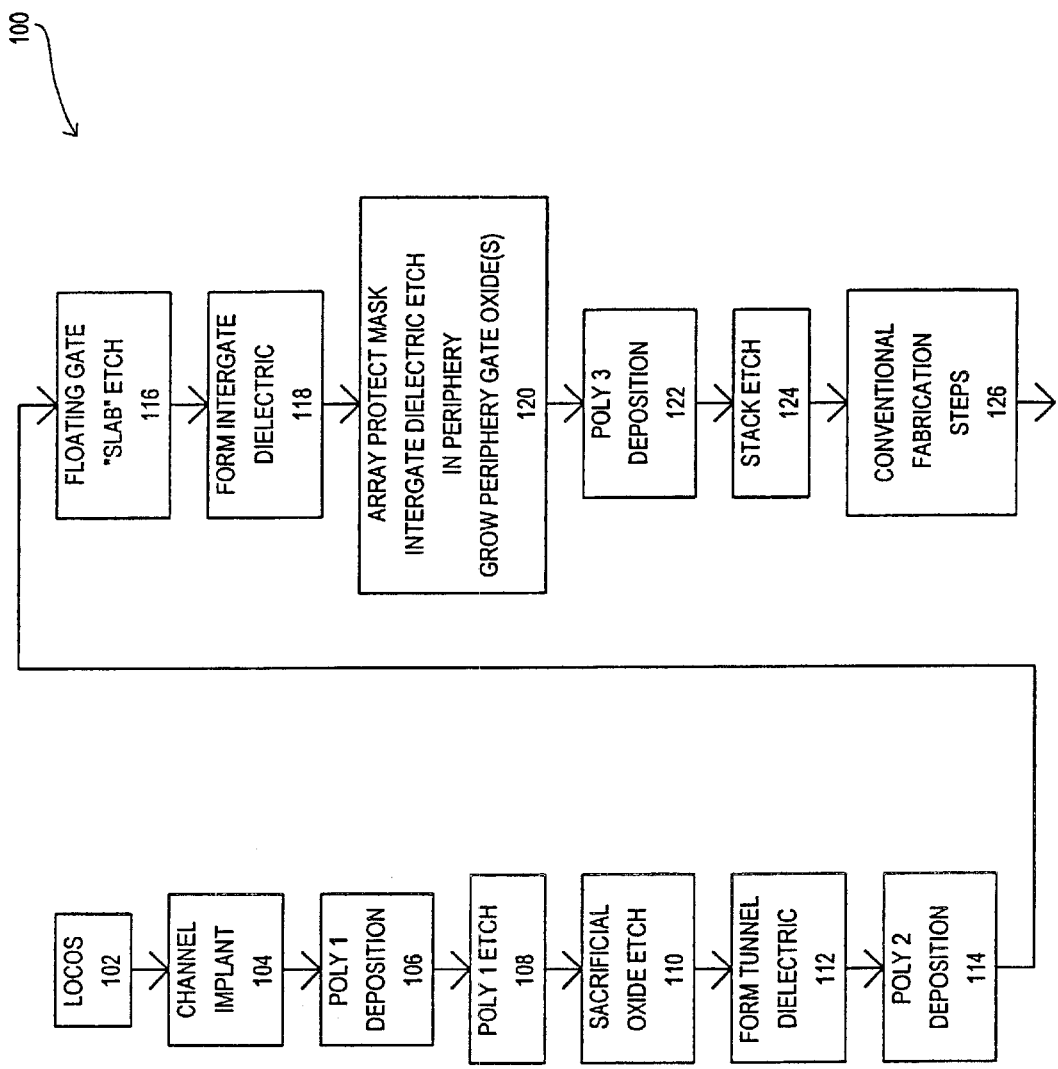
FIG. 2 is a flow chart illustrating a method of manufacturing a flash EPROM according to the preferred embodiment.
Figure 3C:
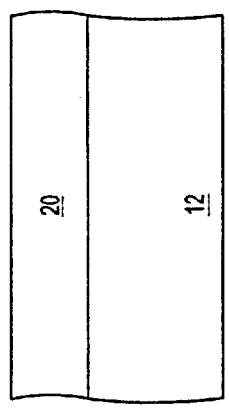
Figure 3B:
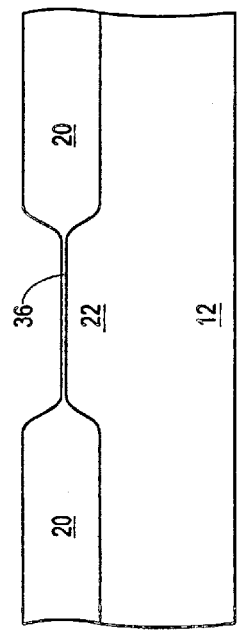
Figure 3A:
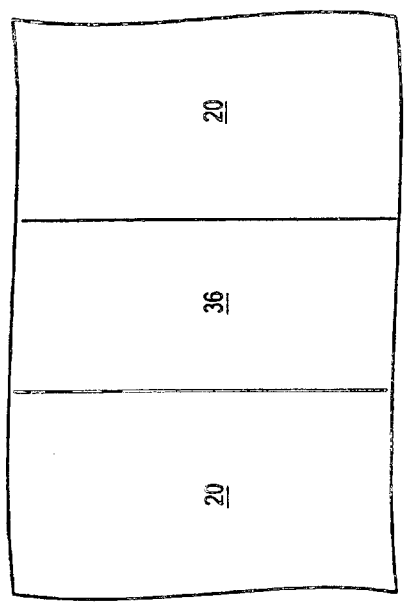

Referring particularly to FIG. 1c, it is noted that, in the preferred embodiment, the floating gate 28 and control gate 32 do not conformally cover the structural element 34b along the direction of line c—c. This particular arrangement arises out of a desire to have a process that is easily integrated into existing flash EPROM fabrication processes, and the desire to have as dense an array as possible. If higher capacitive coupling were desired, at the cost of larger cell sizes and/or process complexity, the stacked gate structure 24 could overlap the structural element 34a, 34b or both, in the direction of line c—c (the channel length direction). Having generally described a NVM cell 10 according to a preferred embodiment, the fabrication process for the NVM cell 10 will now be described. Referring now to FIG. 2, a flow diagram is set forth illustrating, generally, the NVM fabrication steps according to a preferred embodiment. The process is designated by the general reference character 100. In addition, FIGS. 3–11 provide side cross sectional views to illustrate the various steps on the process set forth in FIG. 2. FIGS. 3–11 each include an a, b and c part. These parts follow the views set forth in FIG. 1 (i.e., FIG. 1a is taken along the same line as FIGS. 3a, 4a, 11a, FIG. 1b is taken along the same line as FIGS. 3b, 4b, 11b, etc.).

The process 100 begins with an isolation process such as a LOCOS step 102. Field oxide regions 20 are formed in the substrate 20, separated by thin layer of sacrificial oxide 36. The active regions are established by a subsequent ion implantation (step 104), used to establish the threshold voltage of the NVM cell. The NVM cell following steps 102 and 104 is set forth in FIGS. 3a–3c. The isolation process is designed to achieve an acceptable field threshold voltage to route high voltages in the periphery, and field oxide thickness that gives rise to high coupling coefficients.

Figure 4C:
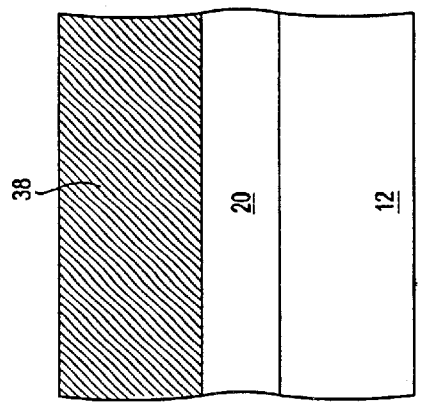
Figure 4B:
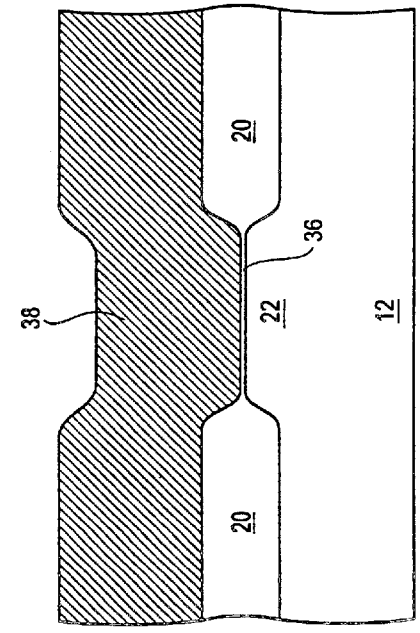
Figure 4A:
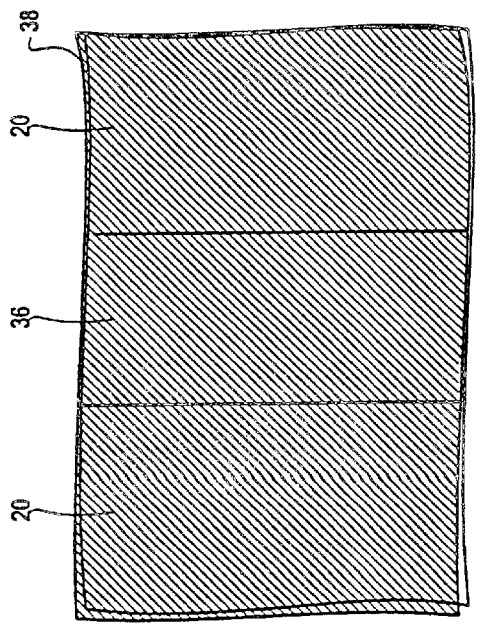

As set forth in FIGS. 4a–4b, unlike conventional flash EPROM fabrication methods for 1-T cells, following the channel implant (step 104) a first, relatively thick layer of polysilicon. (poly 1) 38 is deposited (step 106).In the preferred embodiment the poly 1 is deposited using a conventional polysilicon deposition process resulting in amorphous or polycrystalline grain structures. Doping of the poly 1 is governed by subsequent oxide growth, and can be done in situ, or using ion implantation. Typical deposition temperatures are ~570° C. for amorphous silicon, and ~630° C. for polycrystalline silicon. An in situ doping technique using phosphoryl trichloride (POCl$_3$), or ion implant may be used to dope the poly 1 layer. For ion implantation, typical implant doses are $5 \times 10^{15}/cm^2$. The resulting preferred vertical thickness of the poly 1 layer is between 0.3 and 0.5 μm.

Figure 5A:
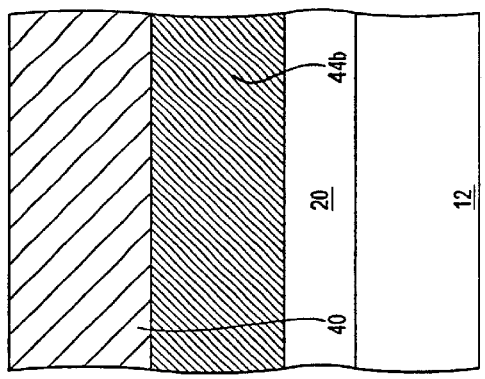
Figure 5B:
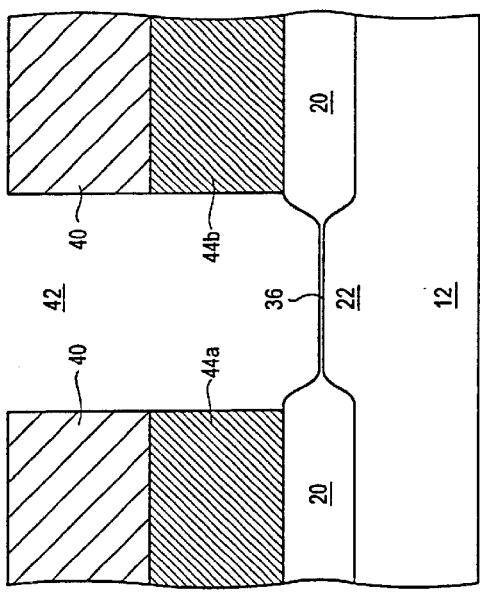
Figure 5C:
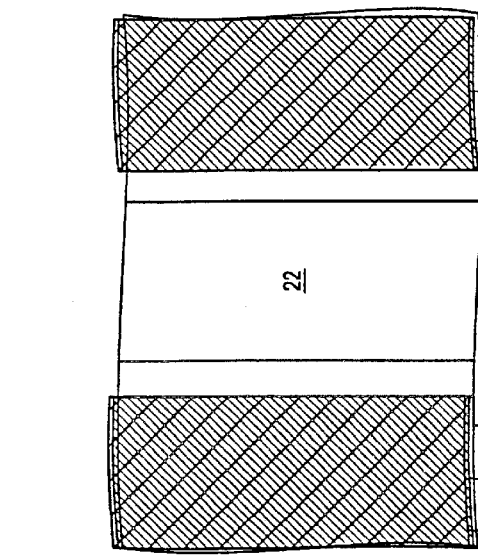

Referring now to FIGS. 5a–5c in conjunction with FIG. 2, following the deposition of the poly 1 38 layer, a poly 1 etch mask 40 of photoresist is created over the poly 1 38, and the poly 1 38 is subjected to an anisotropic etch (step 108).

Figure 6A:
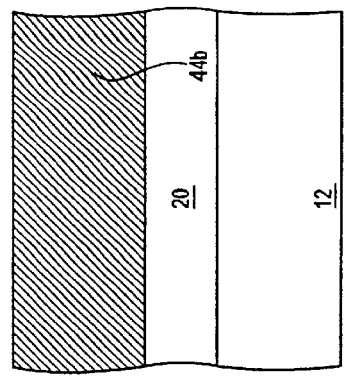
Figure 6B:
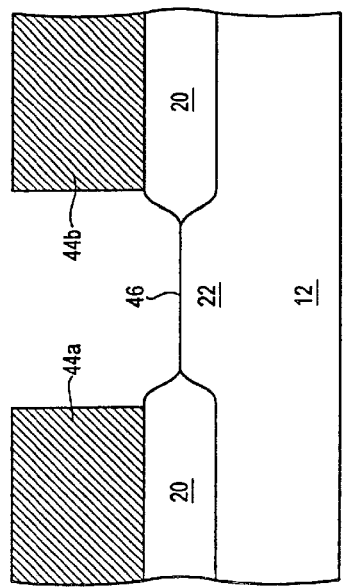
Figure 6C:
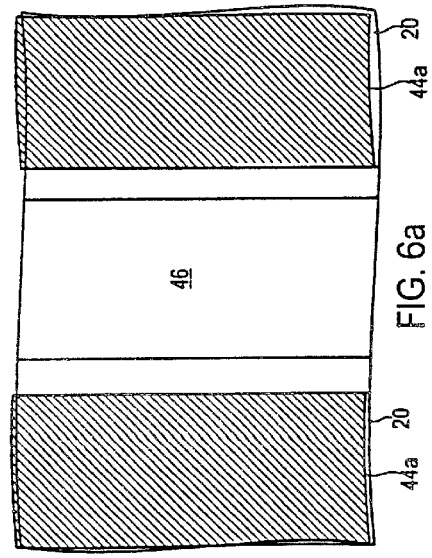

The poly 1 etch mask 40 includes an etch mask opening 42 that exposes the channel region 22. The anisotropic etch etches through the poly layer 38 along the channel region and exposes the underlying sacrificial oxide 36 and sloping "bird's beak" portions of the field oxide 20. The poly 1 38 is thus patterned into poly 1 slabs 44a and 44b that begin at the edge of the channel region 22, and extend away from the channel region 22 on top of the field oxide 20. In the preferred embodiment, the poly 1 etch mask opening 42 is minimally dimensioned. As a result, taking into account misalignment tolerances, and poly 1 critical dimensions, the poly 1 slabs 44a and 44b are as close as is possible to the channel region 22 of the NVM cell. Referring now to FIGS. 6a–6b, following the poly 1 etch (step 108), the exposed sacrificial oxide 36 is etched away (step 110) to create a cleaned active area 46. In the preferred embodiment, the sacrificial oxide etch is a wet chemical etch of 10:1 hydrofluoric acid (HF). The poly 1 etch mask 40 is then stripped off.

Figure 7C:
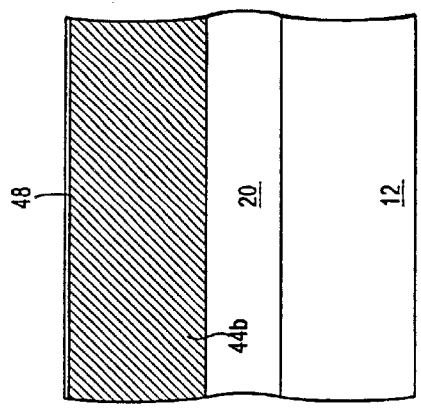
Figure 7B:
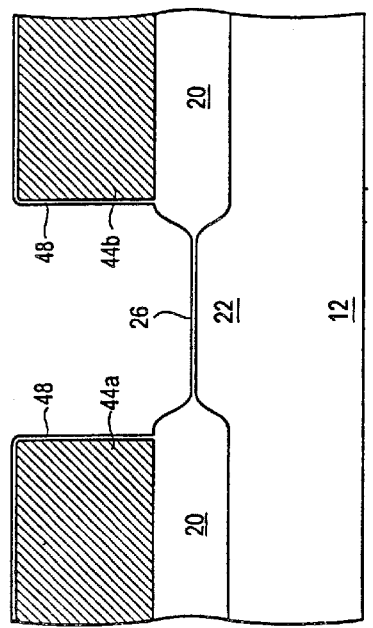
Figure 7A:
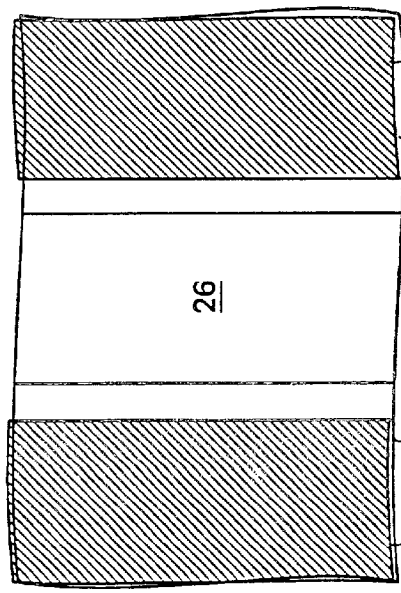

In step 112, as shown in FIGS. 7a–7c, the tunnel oxide 26 is grown on the active area 46. It is noted that this step also produces a first oxide layer 48 on the poly 1 slabs 44a and 44b.

Figure 8C:
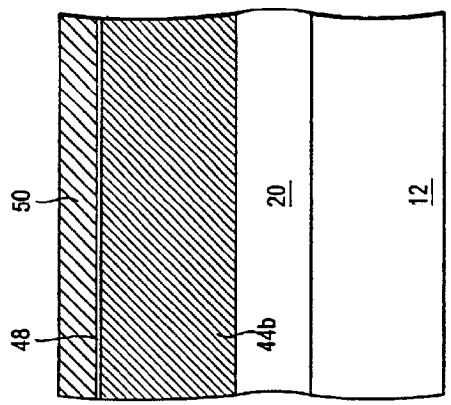
Figure 8B:
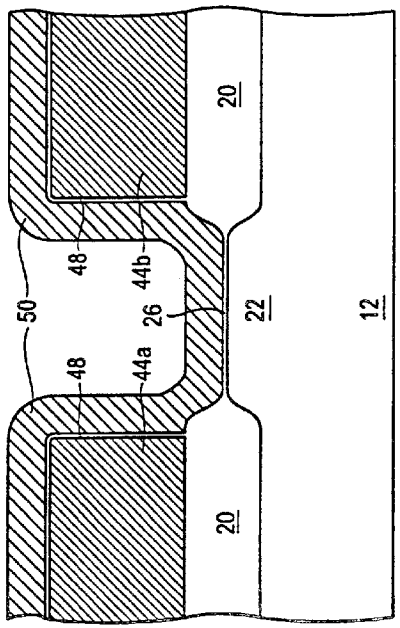
Figure 8A:
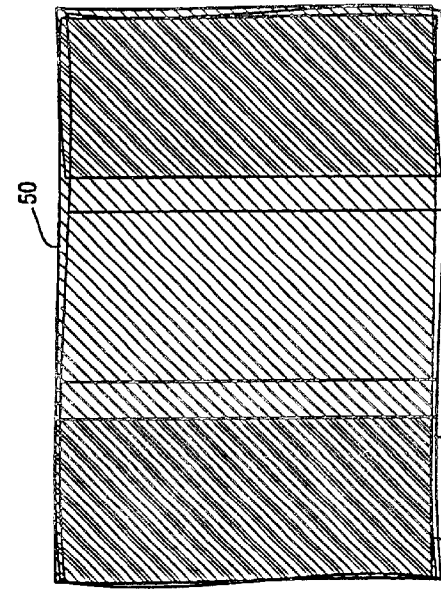

Referring now to FIGS. 8a–8c, following the growth of the tunnel oxide 26, a second layer of polysilicon 50 (poly 2) is deposited (step 114). The poly 2 layer 50 conformally covers the poly 1 slabs 44a and 44b, being separated therefrom by the first oxide layer 48. This conformal covering includes the vertical faces of the poly 1 slabs 44a and 44b which oppose one another from across the channel region 22. In the preferred embodiment, the poly 2 layer is deposited using the conventional deposition techniques described for the poly 1 layer. The poly 2 layer has a smaller vertical thickness, being in the range of 500–1500 Å.

Step 116 of FIG. 2, involves patterning a first floating gate structure, referred to in this description as a floating gate "slab." In the preferred embodiment this step includes the simultaneous etching of both the poly 1 and poly 2 layers (38 and 50). As set forth in FIG. 9a–9c, a poly 2 etch mask 52 of photoresist is developed along the channel length of the EPROM cell. The poly 2 etch mask 52 overlaps portions of the poly 1 slabs 44a and 44b. It is noted that the mask would be the same mask that is used to pattern the floating gate in a conventional 1-T cell flash EPROM process. This enables the present invention to be readily integrated into the existing flash EPROM processes. Referring back to FIG. 2, the NVM cell is subjected to an anisotropic etch which etches through the poly 1 and poly 2 layers (38 and 50) down to the field oxide 20. This results in minimally dimensioned poly 1 rail structures (54a and 54b) that extend in the vertical direction from the field oxide 20, and run parallel to the cell channel width. It is noted that the poly 1 rail structures can actually be smaller than the minimum resolution of the photolithographic equipment (such as a "stepper") for a given technology. The floating gate slab 56 that is created conformally covers the poly 1 rails (54a and 54b) and the cell channel region 22. In the preferred embodiment, an anisotropic reactive ion etch step is used to etch through the poly 1 and poly 2. The poly 2 etch mask 52 is subsequently stripped.

The process 100 continues with the creation of an intergate dielectric 58 (step 118). The intergate dielectric 58 covers the exposed areas of the floating gate slab 56, as well as the exposed vertical surfaces of the poly 1 rails 54a and 54b. As previously described, in the preferred embodiment, the intergate dielectric layer is a composite layer of ONO. This layer is produced by a first oxidation step which oxidizes the exposed polysilicon surfaces following the poly 1-poly 2 etch (step 116). A layer of silicon nitride is then deposited. The silicon nitride is subsequently oxidized to produce another layer of silicon dioxide. In the preferred embodiment, the bottom oxide layer has a thickness in the range of 50–150 Å, and is formed by a dry oxidation at ~1000° C. The middle nitride layer is formed by conventional silicon nitride deposition techniques. The top oxide layer has a thickness in the range of 20–70 Å.

Referring once again to FIG. 2, following step 118, the entire NVM cell array is covered by an array protect mask 59 (step 120). With the array protected from etch steps, initial gate areas for peripheral transistor structures are formed by etching channel regions, and growing gate oxide for MOS transistor devices peripheral to the NVM cell array The NVM cell following steps 118 and 120 is set forth in FIGS. 10a–10c.

Once the intergate dielectric is formed, a third layer of polysilicon 60 (poly 3) is deposited (step 122). The poly 3 layer 60 conformally covers the intergate dielectric 58, and so follows the general shape of the floating gate slab 56, and vertical edges of the poly 1 rail structure (54a and 54b). The NVM cell following this step is set forth in FIGS. 11a–11c. In the preferred embodiment, the poly 3 layer has a thickness in the range of 1 k–2 k Å. The layer has a polycrystalline grain structure and is deposited at a temperature in the range ~630° C. Doping is achieved either by in situ doping, or by ion implantation. In the preferred embodiment, following the deposition of the third layer of polysilicon, a layer of silicide is formed. According to well understood techniques, a layer of tungsten is deposited and annealed with the third polysilicon layer to create a WSi$_2$/poly 3 layer.

FIGS. 12a–12c illustrate the process 100 following a stack etch step (step 124). In the stack etch step 124, a stack etch mask 62 is formed from photoresist over the WSi$_2$/poly 3 layer. The stack etch mask 62 defines the word lines of the array, and runs in strips, defining the NVM cell channel length. Once the etch mask, 2 is formed, an anisotropic stack etch is applied. The stack etch etches through the exposed portions of the WSi$_2$/poly 3 layer, the floating gate slab, and the poly 1 rail structures, down to the field oxide (or tunnel oxide if an active area is underneath). The etching of the poly rail structures results in the two opposing structural elements 34a and 34b associated with each NVM cell. The etching of the floating gate slab 56 creates the floating gate 28. The etching of the poly 3 layer results in the overlying control gates 32.

The fabrication process 100 of the preferred embodiment concludes with conventional flash EPROM fabrication steps (set forth as the general step 126 in FIG. 2). The stacked gate structure that results following the stack etch (step 122) has spacers formed thereon after appropriate sealing oxidation. Self-aligned common source regions can then be etched. Subsequent dielectric contact and metallization steps follow. As these steps are well understood in the art, they have been omitted so as to not unnecessarily complicate the description of the invention.

Figure 13:
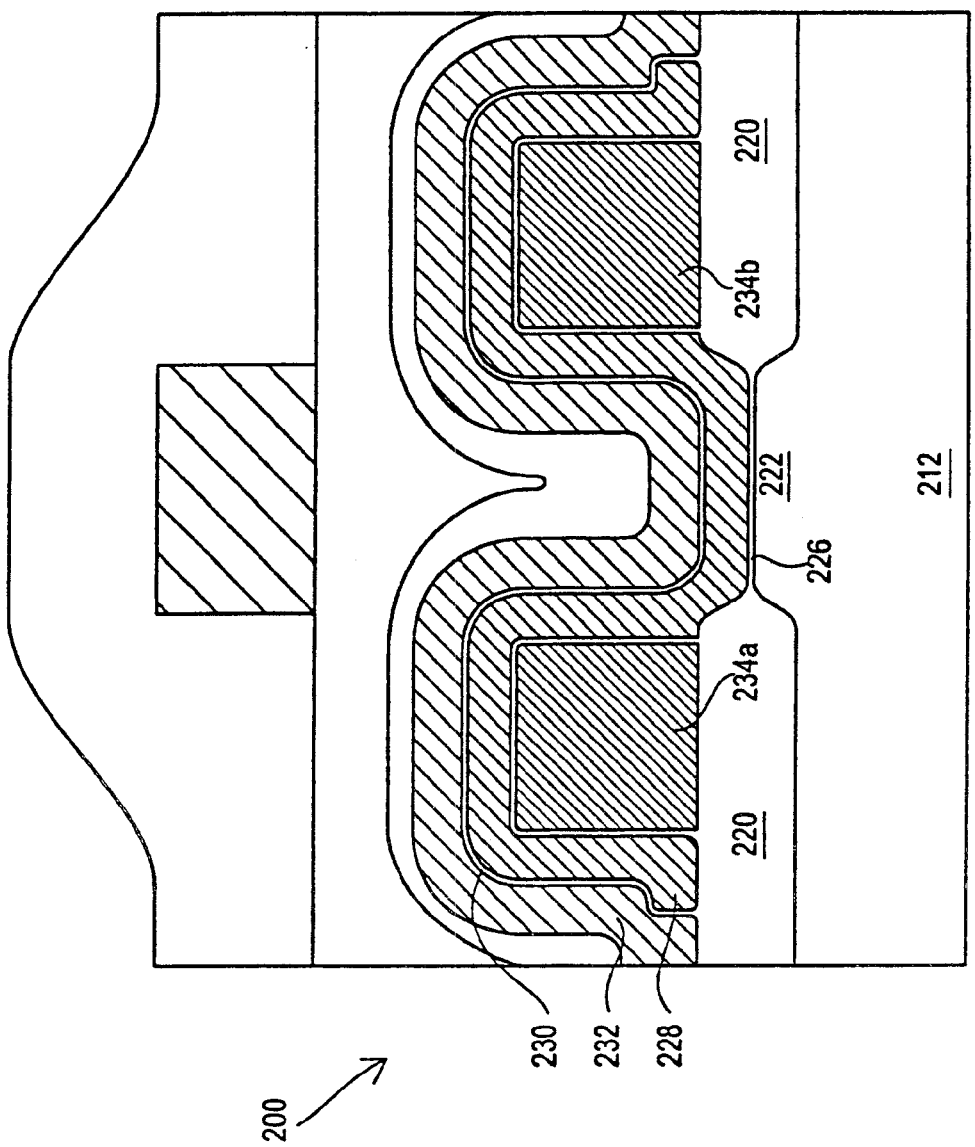
FIG. 13 sets forth a side cross sectional view of an EPROM cell according to an alternate embodiment of the present invention.
Figure 14A:
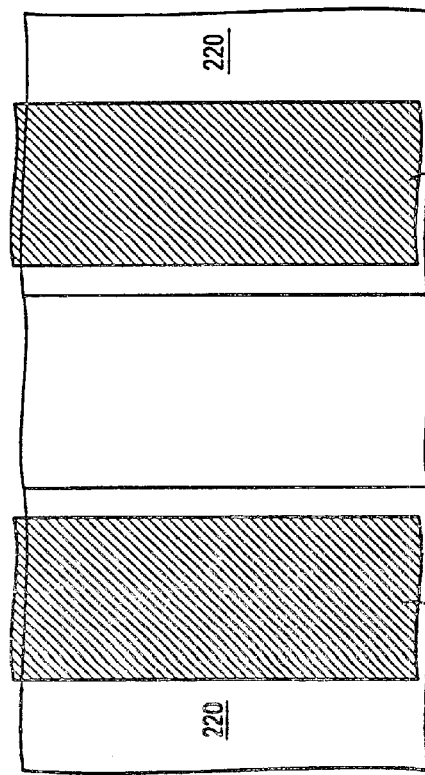
FIGS. 14a–14d set forth top plan views illustrating selective steps in the fabrication of the flash EPROM cell of FIG. 13.

Referring now to FIG. 13, an alternate embodiment is set forth in side cross sectional view. The alternate embodiment is a 1-T flash EPROM cell and is designated by the general reference character 200. Like the preferred embodiment of FIGS. 1a–1c, the alternate embodiment 200 is fabricated on a semiconductor substrate 212 that includes field oxide regions 220. The EPROM 200 has the same general configuration as the preferred embodiment; a channel region 222 formed between opposing field oxide regions 220, structural elements 234a and 234b formed on the field oxide 220, a floating gate 228 conformally covering opposing structural elements (234a and 234b) and the channel region 222, and a control gate 232 conformally covering the floating gate 228. The floating gate 228 is separated from the channel region 222 by a tunnel dielectric 226 and from the control gate by an intergate dielectric 230. Unlike the preferred embodiment, the structural elements 234a and 234b of the alternate embodiment are usually wider than those of the preferred embodiment, being etched in the channel width direction during the initial poly 1 etch step using stepper minimum resolution as the limitation. Further, the floating gate 228 completely covers both vertical surfaces of the structural elements 234a and 234b along the channel width direction. Referring now to FIGS. 14a–14d, a series of top plan views are set forth illustrating the fabrication of the alternate embodiment. FIG. 14a sets forth the flash EPROM cell following the poly 1 etch step (step 108 in the process flow of FIG. 2). The relatively thick layer of poly 1 has been etched into poly 1 rail structures (254a and 254b that run parallel to the active region of the substrate 212 on field oxide regions 220. Thus, unlike the previously described embodiment, the poly 1 layer is patterned into rail like structures before the poly 2 deposition.

Figure 14B:
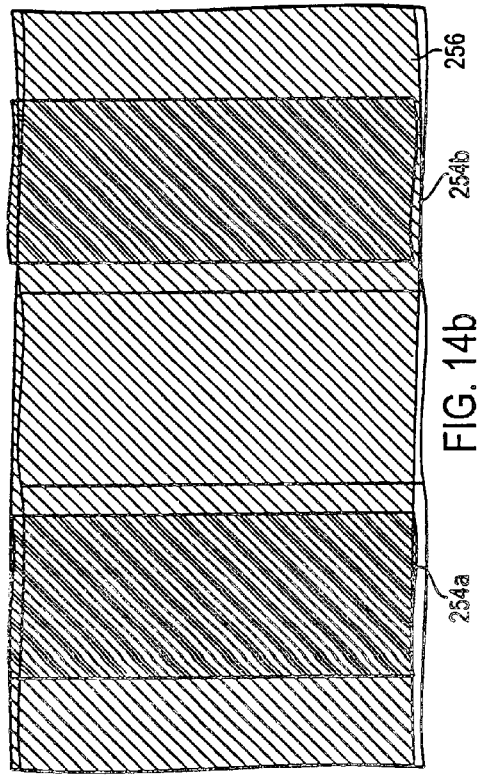

FIG. 14b illustrates the flash EPROM cell following the deposition and etch of a poly 2 layer 250 (steps 114 and 116 in FIG. 2). Unlike the previous embodiment, step 116 does not involve etching through the poly 1 rail structures (254a and 254b), as the resulting floating gate slab 256 completely overlaps both vertical edges of the poly 1 rail structures (254a and 254b). Thus, as shown in FIG. 13, the floating gate slab 256 has four vertical faces (as opposed to the two vertical faces of the previously described embodiment of FIG. 1)

Figure 14C:
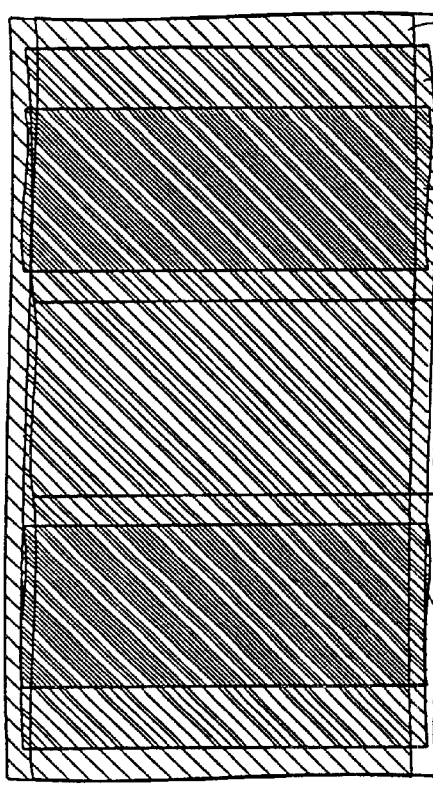

FIG. 14c illustrates the flash EPROM cell following the deposition of a poly 3 layer 260. The poly 3 layer 260 conformally covers the floating gate slab 256, including the four floating gate slab 256 vertical faces.

Figure 14D:
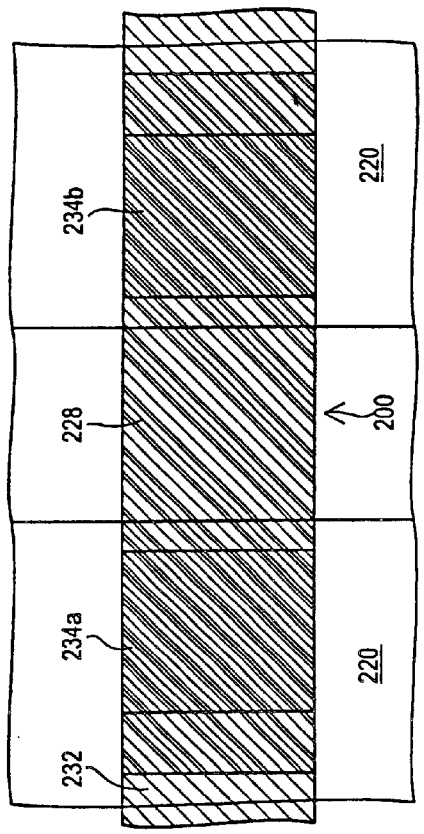

FIG. 14d illustrates the flash EPROM cell following a stack etch step (step 122). The stack etch is essentially the same as that previously described. The resulting EPROM cell however, provides more surface area overlap between the control gate 232 and the floating gate 228, providing for even more capacitive coupling than the previously described embodiment.

Figure 15:
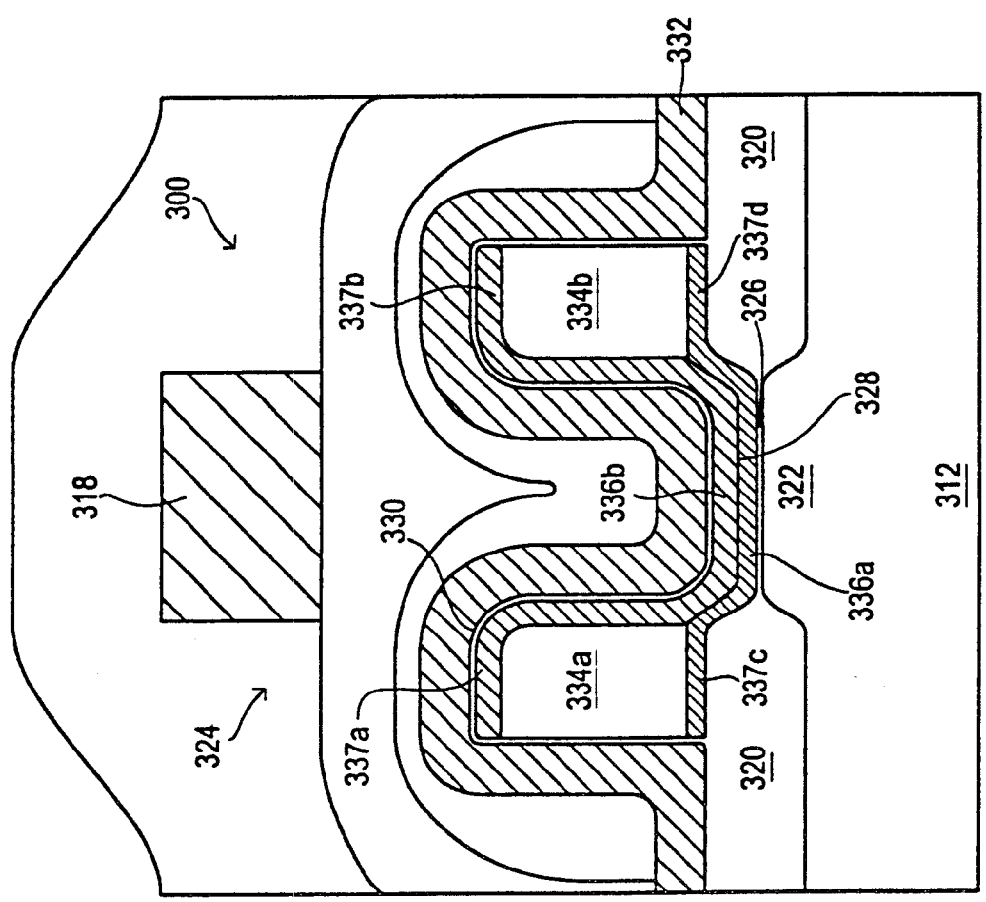
FIG. 15 is a side cross sectional view illustrating a second alternate embodiment of the present invention.
Figure 16:
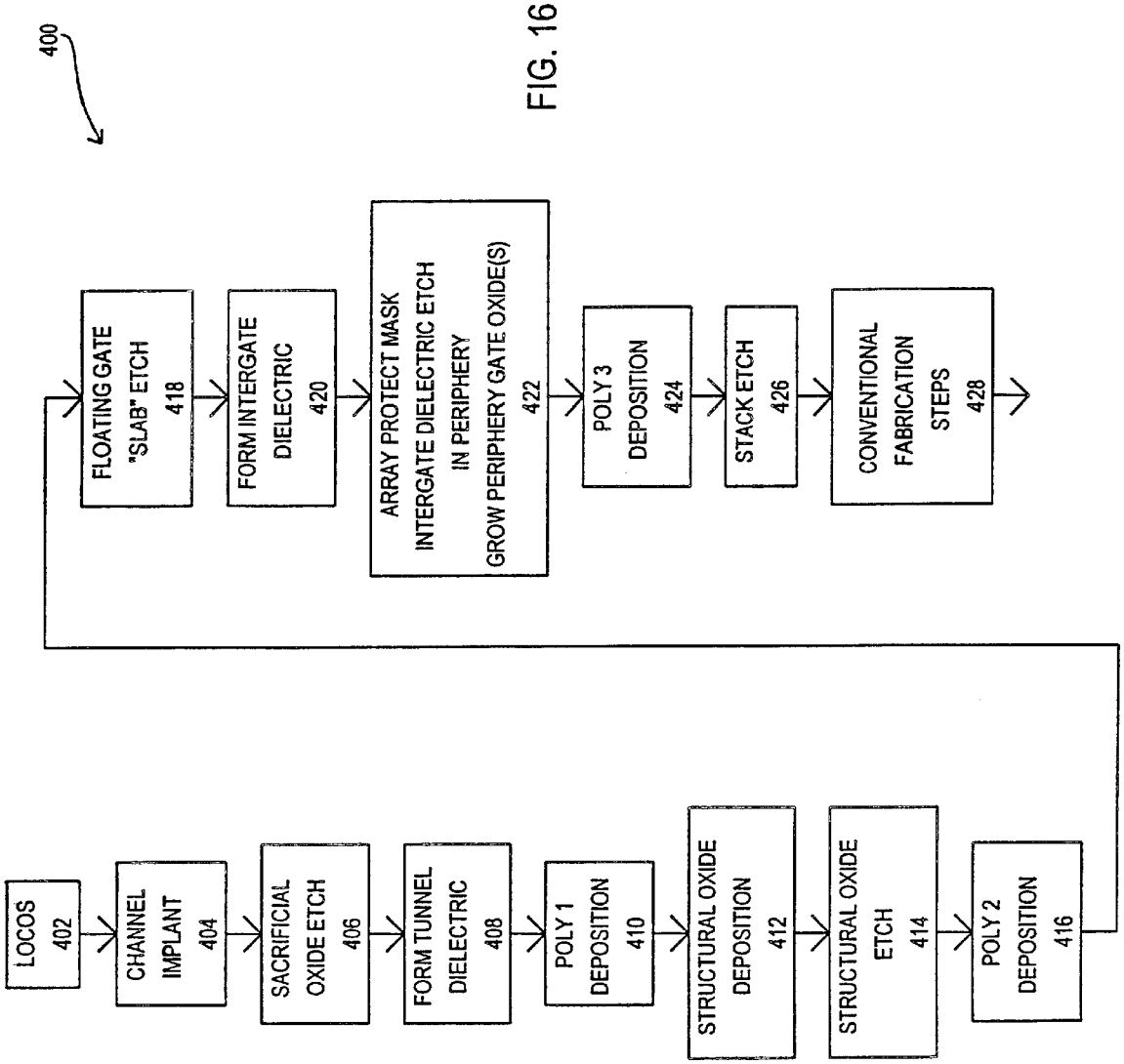
FIG. 16 is a flow chart illustrating a method of manufacturing a flash EPROM according the second alternate embodiment.

FIG. 15 is a side cross sectional view illustrating a second alternate embodiment of the present invention. Like the previously described embodiments, the flash EPROM cell 300 is formed on a substrate 312 and coupled to a bit line 318 by a drain region (not shown). Isolation oxide regions 320 and a channel region 322 are formed on the substrate. The EPROM cell 300 is a stacked gate structure 324, and so includes a tunnel dielectric 326 formed over the channel region 322, a floating gate 328 formed over the tunnel dielectric, an intergate dielectric .330 formed over the floating gate 328, and a control gate 332 formed over the intergate dielectric 330.

The second alternate embodiment differs from the previous embodiments in that structural members (334a and 334b) are formed from a dielectric layer. Further, the floating gate 328 is formed from two layers and so includes a first floating gate member 336a and a second floating gate member 336b. The first and second floating gate members (336a and 336b) are joined over the channel region 322 and split between the structural members (334a and 334b). This arrangement results in a first floating gate part 337a extending over the first structural member 334a, and a second floating gate part 337b extending over the second structural member 334b. A third floating gate part 337d extends beneath the first structural member 334a and a fourth floating gate part 337d extends beneath the second structural member 334b.

FIG. 16 and FIGS. 17a–17d set forth a manufacturing method for the second alternate embodiment. The method 400 begins with the same initial steps as the preferred embodiment. A LOCOS step (step 402) and channel implant (step 404). Unlike the preferred embodiment the sacrificial oxide is then etched (step 406) and the tunnel oxide formed (step 408). A poly 1 layer is then deposited (step 410). The flash EPROM cell following step 410 is set forth in FIG. 17a. The poly 1 layer 338a is disposed over isolation oxide regions 320 and the tunnel dielectric 326. The channel region 322 and substrate 312 are also illustrated. It is noted that the poly 1 layer 338a in the particular embodiment of FIGS. 17a–17d is thinner than the previously described embodiments. The poly 1 is deposited and doped in the same fashion as the poly 1 layer of the first embodiment described.

A structural oxide layer is then deposited over the poly 1 layer (step 412). The structural oxide layer is then etched using a mask similar to that set forth in FIG. 5b. The EPROM cell following the structural oxide etch is set forth in FIG. 17b. The etch results in two structural oxide slabs (339a and 339b) and exposes that portion of the poly 1 layer 338a situated over the channel region 322. The preferred structural oxide thickness is approximately 0.5 μm.

Figure 17A:
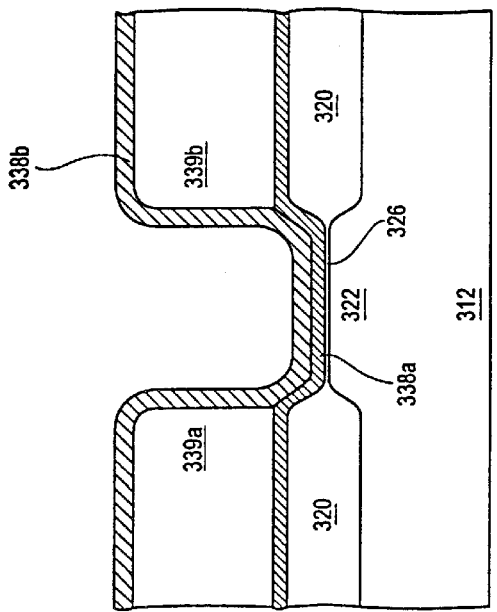
FIGS. 17a–17d illustrate a method of fabricating a flash EPROM cell according to the second alternate embodiment.
Figure 17C:
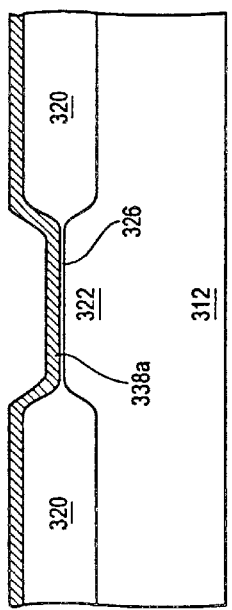
Figure 17B:
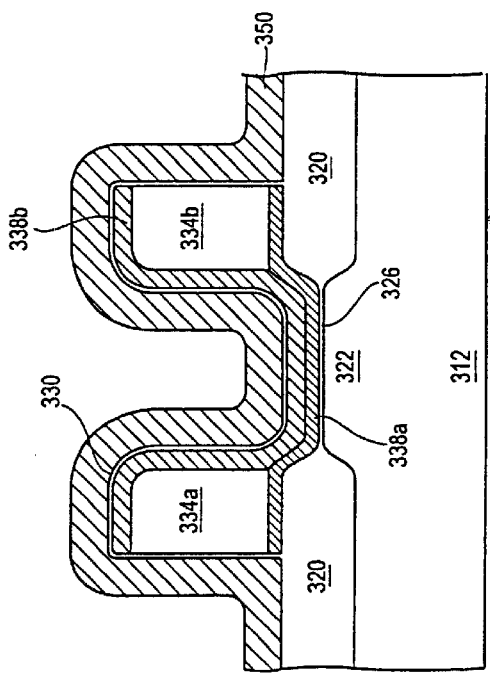
Figure 17D:
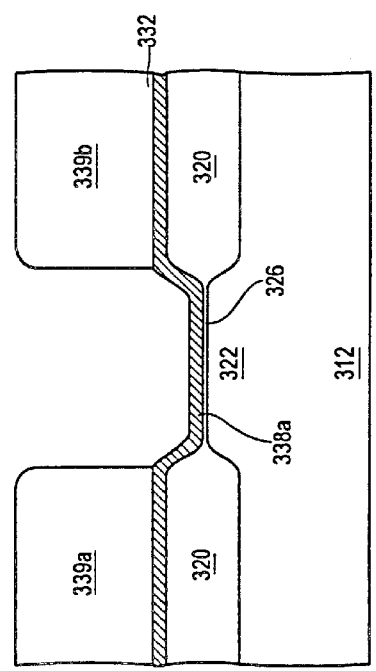

The method 400 continues with the deposition of a poly 2 layer 338b (step 416). The poly 2 layer 338b is disposed over the structural oxide slabs (339a and 339b) and extends down the faces thereof and makes contact with the poly 1 layer 338a. The poly 2 layer 338b is deposited in the same manner as the poly 2 layer of the embodiment described in FIG. 2. The flash EPROM cell following the deposition of the poly 2 layer is illustrated in FIG. 17c.

The flash EPROM method of manufacture proceeds with a floating gate "slab" etch (step 418). This step uses the same mask as illustrated in FIG. 9b. The poly 1 layer 338a, the poly 2 layer 338b, and the structural oxide slabs (339a and 339b) are etched through, resulting in minimally dimensioned oxide structural elements (334a and 334b). As will be recalled, this approach, as in the case of the method set forth in FIG. 2, results in structural elements having dimensions smaller than the minimum resolution of photolithographic equipment. After the formation of the floating gate "slabs," the method 400 proceeds with the same steps as the previously described method 200. A intergate dielectric is formed on the floating gate slabs (step 420). The array of flash cells is protected by an array mask, and gate oxides are grown for peripheral circuits (step 422) A layer of poly 3 350 is then deposited (step 424). The flash cell following the deposition of poly 3 350 is set forth in FIG. 17d. The poly 3 350 conformally covers the remaining poly 2, and the exposed, generally vertical sides of the oxide structural elements (334a and 334b). The poly 3 is deposited with the same conventional techniques described for the poly 3 layer of embodiment set forth in FIG. 2. A stack etch follows (step 426) along with conventional fabrication steps to result in a flash EPROM having cells with the structure set forth in FIG. 15. It is understood that the embodiments set forth herein are only some of the possible embodiments of the present invention, and that the invention may be changed, and other embodiments derived, without departing from the spirit and scope of the invention. Accordingly, the invention is intended to be limited only by the appended claims.

What we claim is:

1. A method of forming a memory cell in a semiconductor material of a first conductivity type, the method comprising:
    defining a channel region in the semiconductor material, the channel region having a first side, an opposing second side, and a third side;
    forming a source region in the semiconductor material, the source region contacting the first side of the channel region, and being doped to have a second conductivity type;
    forming a drain region in the semiconductor material, the drain region contacting the second side of the channel region, and being doped to have the second conductivity type;
    forming a first dielectric region on the semiconductor material, the first dielectric region contacting the third side of the channel region;
    forming a first vertical area enhancing structure over the first dielectric region, the first vertical area enhancing structure being totally electrically isolated;
    forming a layer of dielectric material on the semiconductor material over the channel region;
    forming a floating gate over the first vertical area enhancing structure and the layer of dielectric material;
    forming an intergate dielectric on the floating gate; and
    forming a control gate on the intergate dielectric over the first vertical area enhancing structure.

2. The method of claim 1, wherein the first dielectric region includes field oxide.

3. The method of claim 1, wherein the layer of dielectric material includes a tunnel oxide.

4. The method of claim 1, wherein the first vertical area enhancing structure includes a region of polysilicon and an overlying layer of oxide.

5. The method of claim 1, and further comprising:
    forming a second dielectric region on the semiconductor material, the second dielectric region contacting a fourth side of the channel region, the fourth side opposing the third side; and
    forming a second vertical area enhancing structure over the second dielectric region, the second vertical area enhancing structure being totally electrically isolated,
    forming the floating gate being over the first and the second vertical area enhancing structures, and the layer of dielectric material.

6. The method of claim 1, wherein the first vertical area enhancing structure includes a first sidewall, a second sidewall that opposes the first sidewall, and a top surface, forming the floating gate being over the first sidewall and the top surface.

7. A method of forming a memory cell in a semiconductor material of a first conductivity type, the method comprising:
    defining a channel region in the semiconductor material, the channel region having a first side, an opposing second side, and a third side;
    forming a source region in the semiconductor material, the source region contacting the first side of the channel region, and being doped to have a second conductivity type;
    forming a drain region in the semiconductor material, the drain region contacting the second side of the channel region, and being doped to have the second conductivity type;

forming a dielectric region on the semiconductor material, the dielectric region contacting the third side of the channel region;

forming a vertical area enhancing structure over the dielectric region, the vertical area enhancing structure including a first sidewall, a second sidewall that opposes the first sidewall, and a top surface;

forming a layer of dielectric material on the semiconductor material over the channel region;

forming a floating gate over the vertical area enhancing structure and the layer of dielectric material, forming the floating gate being on the first sidewall and the top surface, forming the floating gate also being on the second sidewall;

forming an intergate dielectric on the floating gate; and forming a control gate on the intergate dielectric over the vertical area enhancing structure.

8. A method of forming a memory cell in a semiconductor material of a first conductivity type; the method comprising:

defining a channel region in the semiconductor material, the channel region having a first side, an opposing second side, and a third side;

forming a source region in the semiconductor material, the source region contacting the first side of the channel region, and being doped to have a second conductivity type;

forming a drain region in the semiconductor material, the drain region contacting the second side of the channel region, and being doped to have the second conductivity type;

forming a dielectric region on the semiconductor material, the dielectric region contacting the third side of the channel region;

forming a vertical area enhancing structure over the dielectric region, the vertical area enhancing structure including a top surface, and a bottom surface that opposes the top surface;

forming a layer of dielectric material on the semiconductor material over the channel region;

forming a floating sate over the vertical area enhancing structure and the layer of dielectric material, forming the floating gate also being on the dielectric region so that forming the bottom surface of the vertical area enhancing structure is on the floating gate over the dielectric region;

forming an intergate dielectric on the floating gate; and forming a control gate on the intergate dielectric over the vertical area enhancing structure.

9. The method of claim 8 wherein the first vertical area enhancing structure is an isolation material.

10. A method of forming a semiconductor device on a semiconductor material of a first conductivity type, the method comprising:

defining a plurality of channel regions defined in the semiconductor material, each channel region having a first side, an opposing second side, a third side, and a fourth side opposing the third side;

forming a plurality of source regions in the semiconductor material, each source region having a corresponding channel region, contacting the first side of the corresponding channel region, and being doped to have a second conductivity type;

forming a plurality of drain regions in the semiconductor material, each drain region having a corresponding channel region, contacting the second side of the corresponding channel region, and being doped to have the second conductivity type;

forming a plurality of first dielectric regions on the semiconductor material, each first dielectric region having a corresponding channel region, and contacting the third side of the corresponding channel region;

forming a plurality of first vertical area enhancing structures over the plurality of first dielectric regions such that forming each first vertical area enhancing structure is over a first dielectric region, each first vertical area enhancing structure being totally electrically isolated;

forming a plurality of dielectric layers on the semiconductor material such that forming each dielectric layer is on a channel region;

forming a plurality of floating gate members on the plurality of dielectric layers and the plurality of first vertical area enhancing structures such that forming each floating gate member is over a dielectric layer and an adjoining first vertical area enhancing structure;

forming a plurality of dielectric formations on the plurality of floating gate members such that forming each dielectric formation is on a floating gate member;

forming a plurality of control gate members on the plurality of dielectric formations such that forming each control gate member is on a dielectric formation.

11. The method of claim 10, and wherein:

the plurality of floating gate members are arranged in rows and columns to form an array.

12. The method of claim 10, and further comprising:

forming a plurality of second dielectric regions on the semiconductor material, each second dielectric region having a corresponding channel region, and contacting the fourth side of the corresponding channel region; and forming a plurality of second vertical area enhancing structures on the plurality of second dielectric regions such that forming each second vertical area enhancing structure is on a second dielectric region, each second vertical area enhancing structure being totally electrically isolated, wherein forming each floating gate member is also over a second vertical area enhancing structure.

13. The method of claim 10, and wherein the first vertical area enhancing structures include polysilicon and an overlying layer of oxide.

14. The method claim 10, and wherein the floating gate members are polysilicon.

15. The method of claim 10, and wherein the control gate members are polysilicon.

16. A method of forming a semiconductor device on a semiconductor material of a first conductivity type, the method comprising:

defining a plurality of channel regions in the semiconductor material, each channel region having a first side, an opposing second side, a third side, and a fourth side opposing the third side;

forming a plurality of source regions in the semiconductor material, each source, region having a corresponding channel region) contacting the first side of the corresponding channel region, and being doped to have a second conductivity type;

forming a plurality of drain regions in the semiconductor material, each drain region having a corresponding channel region, contacting the second side of the corresponding channel region, and being doped to have the second conductivity type;

forming a plurality of dielectric regions on the semiconductor material, each dielectric region having a corresponding channel region, and contacting the third side of the corresponding channel region;

forming a plurality of vertical area enhancing structures over the plurality of dielectric regions such that forming each vertical area enhancing structure is over a dielectric region, each vertical area enhancing structure including a top surface, and a bottom surface that opposes the bottom surface;

forming a plurality of dielectric layers on the semiconductor material such that forming each dielectric layer is on a channel region;

forming a plurality of floating gate members on the plurality of dielectric layers and the plurality of vertical area enhancing structures such that forming each floating gate member is over a dielectric layer and an adjoining vertical area enhancing structure, forming each floating gate member also being on a dielectric region so that forming the bottom surface of the vertical area enhancing structure is on the floating gate over the dielectric region;

forming a plurality of dielectric formations on the plurality of floating gate members such that forming each dielectric formation is on a floating gate member; and forming a plurality of control gate members on the plurality of dielectric formations such that forming each control gate member is on a dielectric formation.

17. The method of claim 16, and wherein each vertical area enhancing structure also includes a first sidewall surface and a second sidewall surface opposing the first sidewall surface, forming each floating gate member being on the first and second sidewall surfaces, and the top surface.

18. The method of claim 16, wherein the vertical area enhancing structures include a layer of dielectric material.

19. A method of forming a memory cell in a semiconductor material of a first conductivity type, the method comprising:

defining a channel region in the semiconductor material, the channel region having a first side, an opposing second side, and a third side;

forming a source region in the semiconductor material, the source region contacting the first side of the channel region;

forming a drain region in the semiconductor material, the drain region contacting the second side of the channel region;

forming a dielectric region on the semiconductor material, the dielectric region contacting the third side of the channel region;

forming a vertical area enhancing structure over the dielectric region, the vertical area enhancing structure having no electrical connection;

forming a dielectric layer on the semiconductor material over the channel region;

forming a floating gate over the vertical area enhancing structure and the dielectric layer;

forming an intergate dielectric over the floating gate; and forming a control gate on the intergate dielectric.

20. The method of claim 19, and wherein the vertical area enhancing structure includes a first sidewall, a second sidewall that opposes the first sidewall, a top surface, and a bottom surface that opposes the top surface, forming the floating gate being on the first sidewall and the top surface.

21. A method of forming a memory cell in a semiconductor material of a first conductivity type, the method comprising:

defining a channel region in the semiconductor material, the channel region having a first side, an opposing second side, and a third side;

forming a source region in the semiconductor material, the source region contacting the first side of the channel region;

forming a drain region in the semiconductor material, the drain region contacting the second side of the channel region;

forming a dielectric region on the semiconductor material, the dielectric region contacting the third side of the channel region;

forming a vertical area enhancing structure only over the dielectric region, the vertical area enhancing structure including a first sidewall, a second sidewall that opposes the first sidewall, a top surface, and a bottom surface that opposes the top surface;

forming a dielectric layer on the semiconductor material over the channel region;

forming a floating gate over the vertical area enhancing structure and the dielectric layer, forming the floating gate being on the first sidewall and the top surface, forming the floating gate also being on the second sidewall;

forming an intergate dielectric over the floating gate; and forming a control gate on the intergate dielectric.

22. A method of forming a memory cell in a semiconductor material of a first conductivity type, the method comprising:

defining a channel region in the semiconductor material, the channel region having a first side, an opposing second side, and a third side;

forming a source region in the semiconductor material, the source region contacting the first side of the channel region;

forming a drain region in the semiconductor material, the drain region contacting the second side of the channel region;

forming a dielectric region on the semiconductor material, the dielectric region contacting the third side of the channel region;

forming a vertical area enhancing structure only over the dielectric region, the vertical area enhancing structure including a first sidewall, a second sidewall that opposes the first sidewall, a top surface, and a bottom surface that opposes the top surface;

forming a dielectric layer on the semiconductor material over the channel region;

forming a floating gate over the vertical area enhancing structure and the dielectric layer, forming the floating gate being on the first sidewall and the top surface, forming the floating gate also being on the dielectric region so that forming the bottom surface of the vertical area enhancing structure is on the floating gate over the dielectric region;

forming an intergate dielectric over the floating gate; and forming a control gate on the intergate dielectric.

* * * * *

UNITED STATES PATENT AND TRADEMARK OFFICE
CERTIFICATE OF CORRECTION

PATENT NO. : 6,429,076 B2
DATED : August 6, 2002
INVENTOR(S) : Perumal Ratnam and Ritu Shrivastava It is certified that error appears in the above-identified patent and that said Letters Patent is hereby corrected as shown below:

Column 12,
Line 61, change "source, region" to -- source region --.
Line 62, change "region)" to -- region --.

Signed and Sealed this

First Day of October, 2002

Attest:

Attesting Officer

JAMES E. ROGAN
Director of the United States Patent and Trademark Office